(12) United States Patent
Goyal et al.

(10) Patent No.: US 10,935,593 B2
(45) Date of Patent: Mar. 2, 2021

(54) METHOD OF RESONANCE ANALYSIS FOR ELECTRICAL FAULT ISOLATION

(71) Applicant: Intel Corporation, Santa Clara, CA (US)

(72) Inventors: Deepak Goyal, Phoenix, AZ (US); Mayue Xie, Phoenix, AZ (US); Sivaseetharaman Pandi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 463 days.

(21) Appl. No.: 15/857,520

(22) Filed: Dec. 28, 2017

(65) Prior Publication Data

US 2019/0204376 A1   Jul. 4, 2019

(51) Int. Cl.
| | | |
|---|---|---|
| *G01R 31/28* | (2006.01) | |
| *G01R 23/20* | (2006.01) | |
| *H04L 1/00* | (2006.01) | |

(52) U.S. Cl.
CPC ......... *G01R 31/2813* (2013.01); *G01R 23/20* (2013.01)

(58) Field of Classification Search
CPC ......... H04L 1/00; H04L 2201/00; G05B 1/00; G05B 2219/00; H04B 1/00; H04B 2201/00
See application file for complete search history.

(56) References Cited

U.S. PATENT DOCUMENTS

| | | | | |
|---|---|---|---|---|
| 10,135,147 B2* | 11/2018 | Henry | .................... | H01Q 13/26 |
| 10,312,567 B2* | 6/2019 | Bennett | .................... | H01P 5/08 |
| 10,374,316 B2* | 8/2019 | Bennett | .................... | H01Q 5/55 |
| 2004/0245994 A1* | 12/2004 | Schlapp | ................ | G01R 31/11 324/500 |
| 2010/0141264 A1* | 6/2010 | Ravot | .................... | G01R 31/11 324/533 |
| 2015/0357257 A1* | 12/2015 | Or-Bach | ............. | H01L 23/5226 257/774 |
| 2018/0159592 A1* | 6/2018 | Rappaport | ............... | H04B 3/46 |

* cited by examiner

*Primary Examiner* — Jermele M Hollington
*Assistant Examiner* — Temilade S Rhodes-Vivour
(74) *Attorney, Agent, or Firm* — Schwegman Lundberg & Woessner, P.A.

(57) ABSTRACT

A method, system and computer readable medium for determination of distance to an electrical fault within a device. A signal generator excites the device with an electrical input signal. The device comprises an open circuited electrical transmission line. A frequency domain analyzer analyzes part of the signal reflected from the device for determination of the locations of resonant frequency of the signal within the device. A computer calculates the distance to the fault within the device, based on the resonant frequency. The distance to the fault is one quarter wavelength distance into the device at the resonant frequency. A frequency sweeper sweeps the frequency of the input signal and repeated calculation of the distance to the fault made at a plurality of resonant frequencies during the frequency sweep confirms the distance to the fault by convergence of the result of the repeated calculations to substantially the same location.

26 Claims, 14 Drawing Sheets

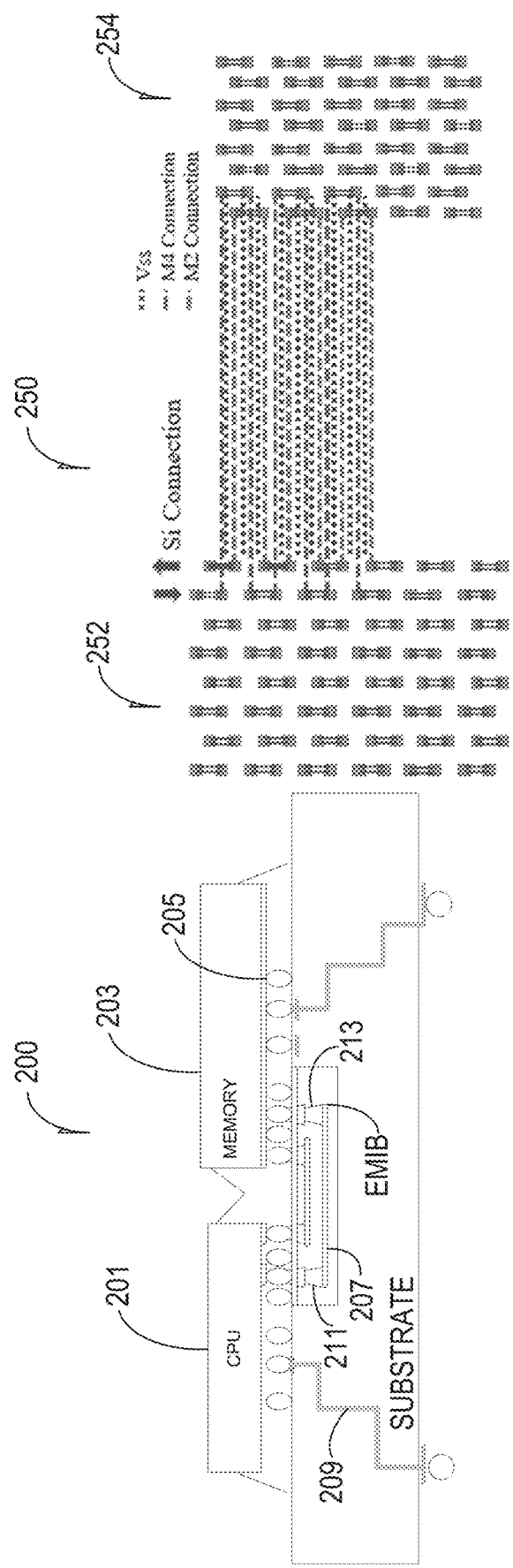

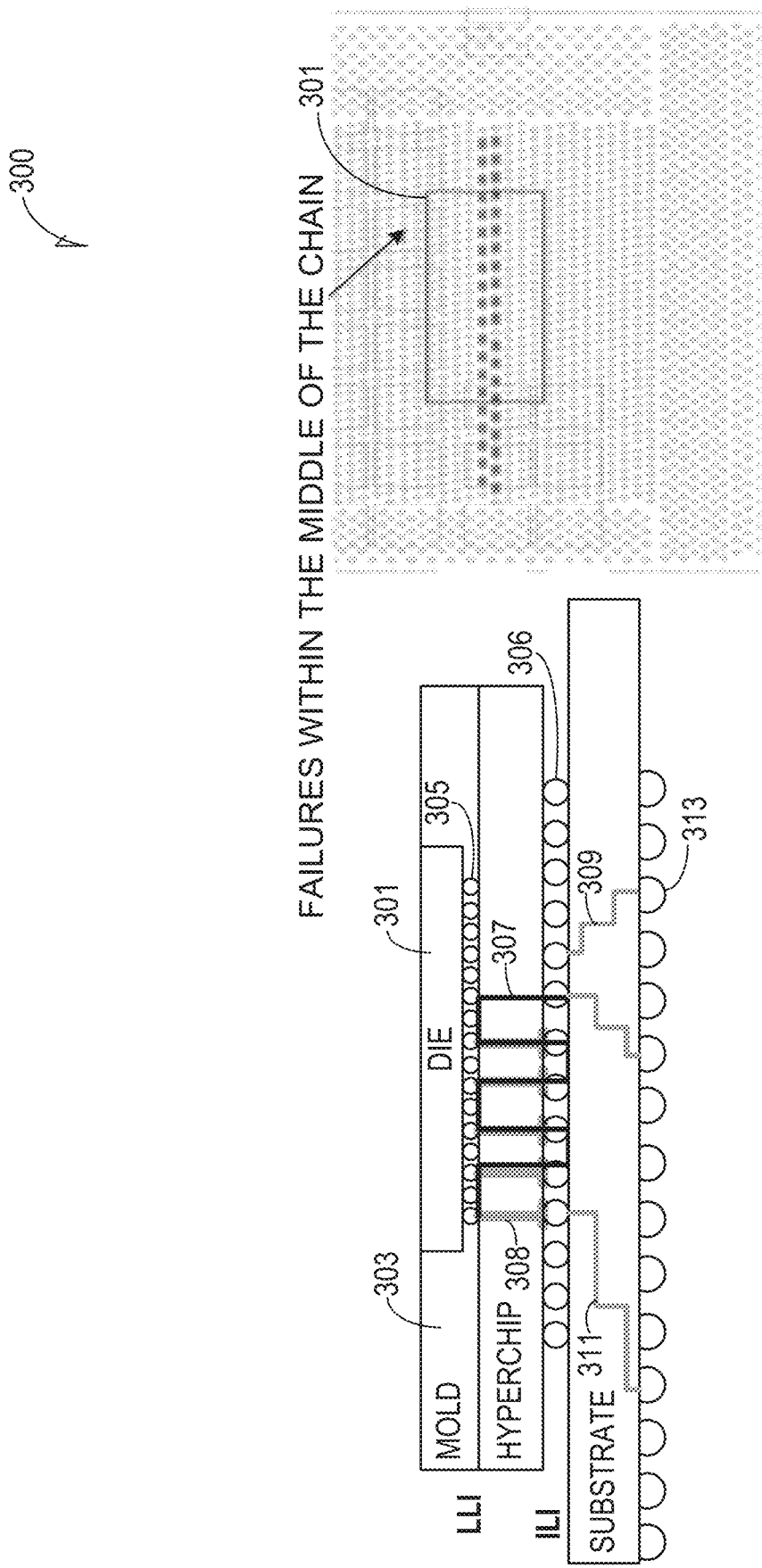

METHOD OF RESONANCE ANALYSIS FOR ELECTRICAL FAULT ISOLATION

TECHNICAL FIELD

Embodiments described herein generally relate to isolating electrical failures in long and lossy interconnects in semiconductor manufacture processes, with high resolution, speed and accuracy to improve process and product yield.

BACKGROUND

Integration of more components on a semiconductor package through two and a half dimensional (2.5D) and three dimensional (3D) packaging technologies (e.g., Embedded Multichip Interconnect Bridge (EMIB) and hyperchip technology) are driving ever-increasing package complexity. Some typical package architectures are package on package (PoP), EMIB, hyperchip with Through Silicon Vias (TSV) and silicon (Si) interposer technology among others. These advanced package technologies allow companies to create a system in a package (SIP) by integrating dies/packages horizontally and/or vertically. These package designs provide design flexibility, high performance and affordable cost. They are used for various platforms, such as CPUs, memory, Dynamic Random Access Memory (DRAM), analog/radio frequency (Analog/RF), and or other special function devices, to meet diverse market needs. These packaging designs often involve long and lossy interconnects for signal transmission. This is particularly true for Si EMIB, TSV and Si interposers because Si traces have very tight design rules to allow for high density, high bandwidth communication. It is highly important to develop the capability of isolating electrical failures in long and lossy interconnects with great resolution, speed and accuracy to improve process and product yield in such products.

BRIEF DESCRIPTION OF THE DRAWINGS

FIGS. 2A and 2B illustrate Embedded Multichip Interconnect Bridge (EMIB) technology according to some embodiments.

FIGS. 3A and 3B illustrate hyperchip technology design with micro-bumps and TSV chains, according to some embodiments.

DESCRIPTION OF EMBODIMENTS

Figure 1:
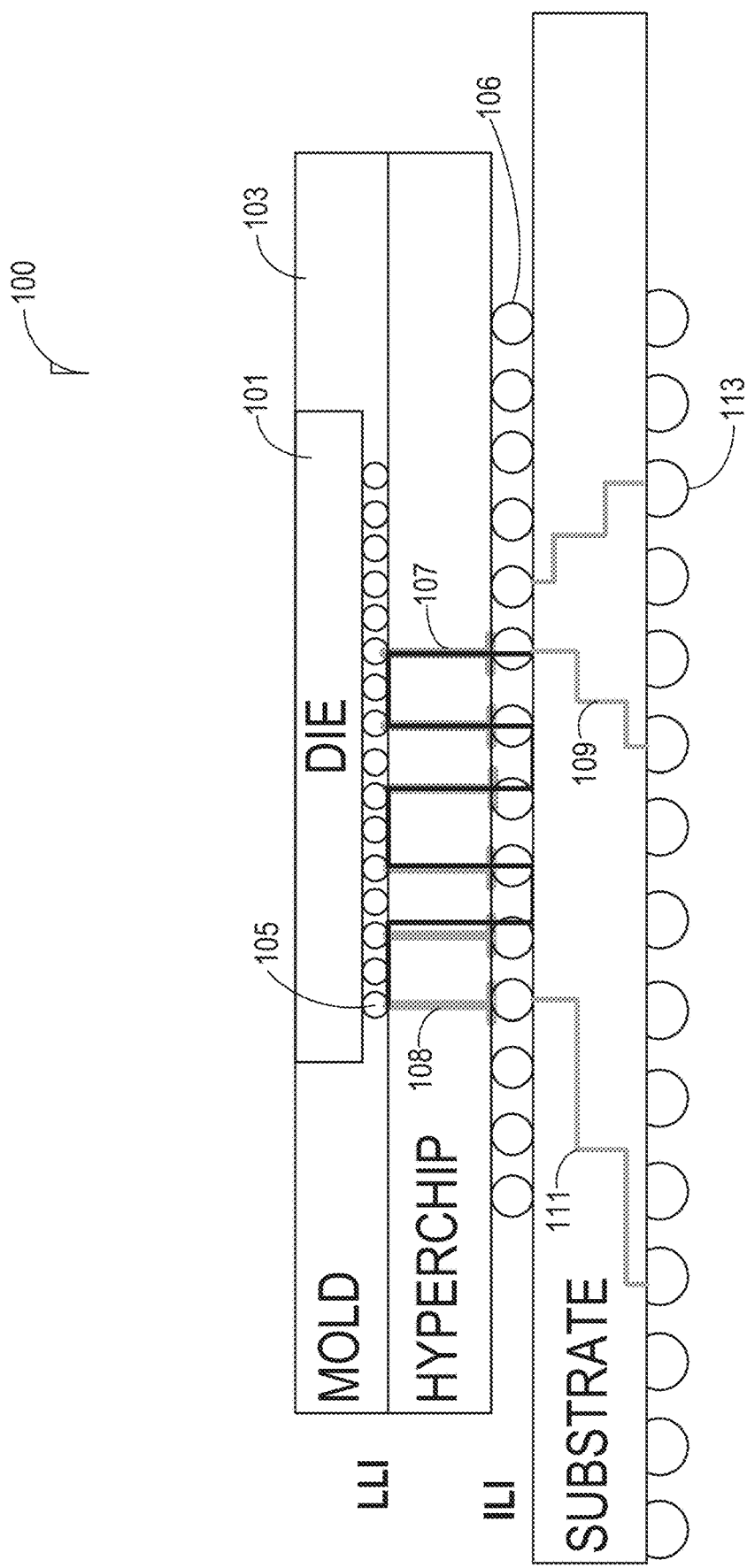
FIG. 1 illustrates a hyperchip enabled high density design for high bandwidth communication, according to some embodiments.

FIG. 1 illustrates a hyperchip enabled high density design for high bandwidth communication, according to some embodiments. As seen in FIG. 1, die 101, which may be surrounded by mold in some embodiments, may be connected by traces 107 on the outside of the hyperchip body, which may be silicon, as well as by through-silicon vias 108. Solder balls 105 enable connection of the die 101 to connections such as 107, 108. Solder balls 106 allow connection to levels of through silicon vias, while solder balls 313 allow the die 101 to communicate with the outside world. The hyperchip package can have a long micro-bump chain, a TSV chain and a long net as shown in FIG. 1. Metal traces inside the Si are very lossy for high frequency signals and currently available technology usually cannot detect the defect location for a long or chained Si bridge metal lines.

FIGS. 2A and 2B illustrate Embedded Multichip Interconnect Bridge (EMIB) technology according to some embodiments. EMIB is a unique package technology with current industry leadership on cost, performance and form factor. A group of EMIB nets can be as long as 250 mm which is well beyond the measurement capability of currently available tools. An Embedded Multi-Die Interconnect Bridge (EMIB) is an elegant and cost-effective approach to in-package high density interconnect of heterogeneous chips, sometimes referred to as 2.5D package integration. Instead of using a large silicon interposer typically found in other 2.5D approaches, EMIB uses a very small bridge die, with multiple routing layers. This bridge die is embedded as part of the substrate fabrication process. There can be many embedded bridges in a single substrate, providing extremely high I/O and well controlled electrical interconnect paths between multiple die, as needed. The chips do not have to be connected to the package through a silicon interposer with TSVs. Micro-bumps may be used for high density signals, and coarser pitch, standard flip chip bumps may be used for direct power and ground connections from chip to package.

The cross-section 200 of FIG. 2A shows two die 201, 203 that have been assembled to a package with micro-bumps 205 providing die-to-die connections through a silicon EMIB bridge chip. The EMIB bridge chip is a small piece of silicon embedded in some embodiments essentially only under the edges of the two interconnecting die 201, 203. This allows for most size die to be attached in multiple dimensions, eliminating additional physical constraints on heterogeneous die attachment within the theoretical limits.

Some embodiments have been developed that contain two or more semiconductor dies such as 201, 203 attached to a substrate and the interconnect bridge EMIB that has connectors such as 211, 213, which may be pads or lands to connect one die to one or more other dies via traces such as

207. In one embodiment, the interconnect bridge attaches a central processing unit (CPU) 201 to memory (MEMORY) 203. This allows the dies to communicate data directly between each other. Otherwise, these dies would send signals outside the package to a hub or other device which would then send the data back into the package and to the other die. Other types of dies and connections may also be possible such that the die in such a package is embedded into the substrate. In one embodiment the dies 201, 203 are connected to the outside world by connections such as 209 which may comprise layer-to-layer routing.

A certain part a die's total interconnect area used as a bridge attach region is seen in FIG. 2B. In some embodiments, the bridge may attach to about 20% of a Controlled Collapse Chip Connection (C4) high density area of the memory chip. The high density interconnect area outside of the bridge attach region portion may contain power rails, ground lines such as the dotted Vss, test ports, etc., and other connections such as the solid dash M4 connection and the solid dash M12 connection. This area may use C4 or any of a variety of other connection technologies. The bridge is embedded into the package substrate. The Si connections illustrate connections, such as vertical connections 208, 209, of which there could be hundreds in some embodiments, within the EMIB that connect the die 201 to the memory 203 in FIG. 2A.

FIGS. 3A and 3B illustrate a hyperchip technology design with micro-bumps 305 and TSV chains 309, 311, according to some embodiments. Micro-bumps such as 305 and TSV chains such as 309, 311 are highly important elements of hyperchip technology, and methods to test and fault isolate micro-bump interconnects and TSV chains, sometimes referred to as daisy chains, will be highly important for product development. Usually, long and lossy interconnects also prevail in assembly test vehicles for package technology development including daisy chain designs. FIG. 3B is a top view of die 301 of FIG. 3A. The two rows of parallel dots in bold font in box (i.e., die) 301 represent some of the micro bumps 305. Any open faults, short circuits or other faults along these daisy chains or long substrate traces are hard to identify owing to their substantial lengths and their placement in lossy media, but will need to be detected. Due to severe signal loss along the length of the chain, the high-bandwidth detection signal used by failure isolation attenuates too quickly to provide useful information. There is no currently available reliable way to isolate failures in these long and lossy interconnects if there are any process defects. Existing Time Domain Reflectometer/Electro-Optical TeraHertz Pulse Reflectometry (TDR/EOTPR) techniques have an upper limit on the distance within which an open fault can be identified. The TDR/EOTPR pulses fade away below the noise floor and become undetectable by the receiver, as they propagate along these routes. The pulse signal degradation is owing to the dielectric losses of the substrate and of the silicon nitride or perhaps other silicon compounds through which the daisy chains are routed. The signal loss is determined by the dissipation factor of a medium. The dissipation factor of silicon is larger than that of epoxy substrate. This indicates that the detectable penetration distance of the TDR pulse is farther within epoxy substrate than within silicon nitride.

Figure 4A:
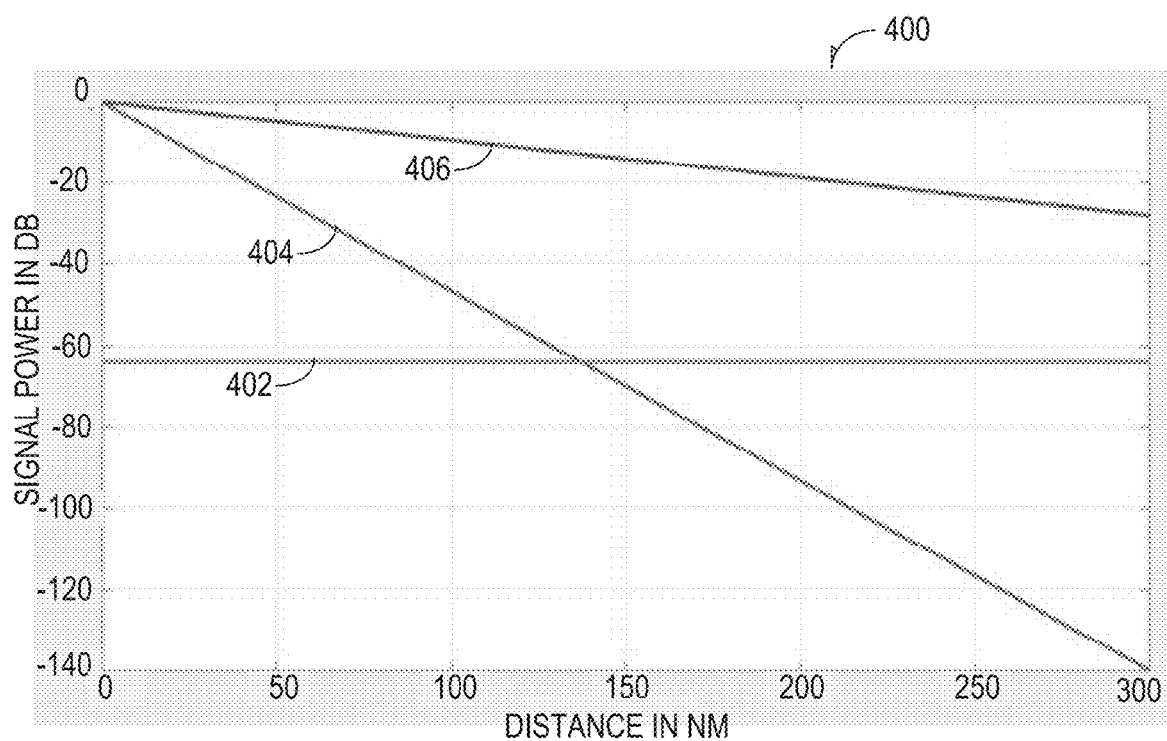
FIGS. 4A and 4B illustrate limitations of a Time Domain Reflectometer/Electro-Optical TeraHertz Pulse Reflectometry (TDR/EOTPR)-based fault isolation method, according to some embodiments.
Figure 4B:
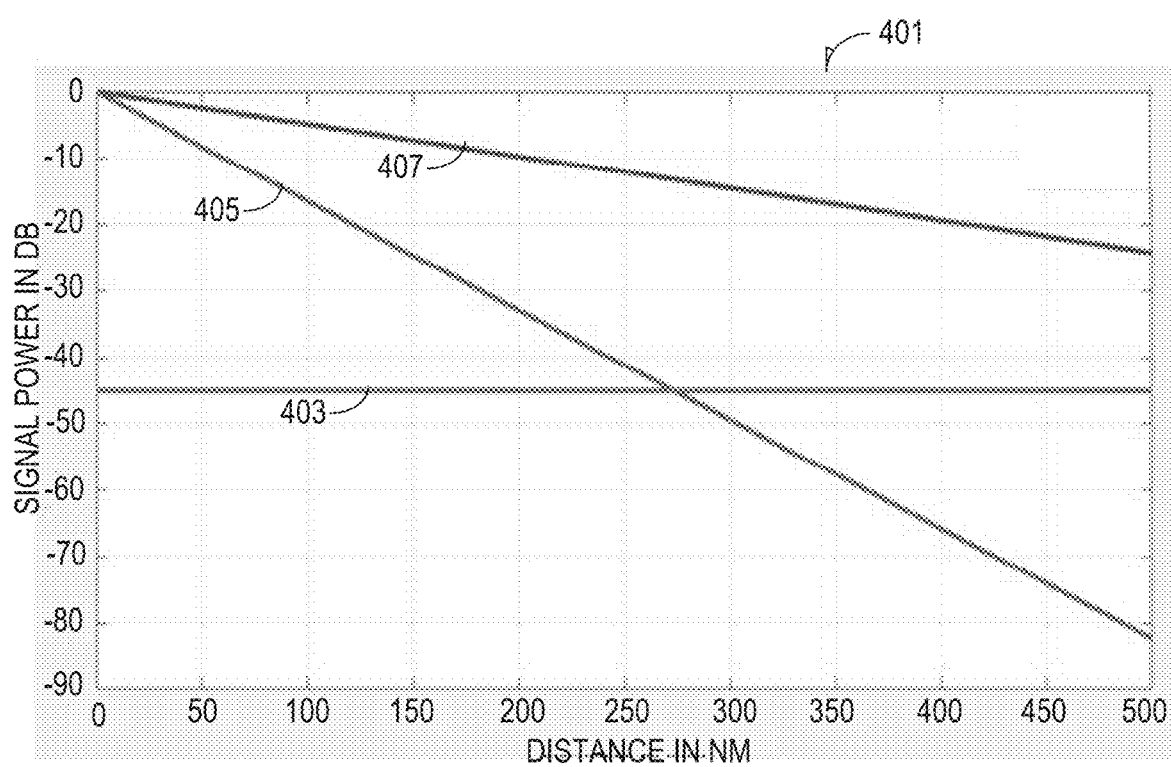

In additional detail, FIGS. 4A and 4B illustrate limitations of a TDR/EOTPR based fault detection method, according to some embodiments. The figures show the theoretical limit on the maximum distance that can be penetrated by a TDR pulse. Beyond this theoretical limit, the power in the TDR pulse falls below the noise floor and becomes undetectable.

It is thus highly important to develop the capability of isolating electrical failures in long and lossy interconnects with great resolution and accuracy to improve process and product yield. TDR/EOTPR based fault detection methods have been found to be ineffective due to signal degradation and loss through transmission length. Higher frequencies make the situation worse. In FIG. 4A, graph 404 represents signal strength as the signal travels within silicon. Graph 406 represents the signal strength as the signal travels through the substrate. Graph 402 represents the noise floor. In FIG. 4B graph 405 represents signal strength as the signal travels within Silicon and graph 407 represents the signal strength as the signal travels through the substrate. Graph 403 represents the noise floor. In signal theory, the noise floor is the measure of the signal created from the sum of all the noise sources and unwanted signals within a measurement system, where noise is defined as any signal other than the one being monitored. The horizontal axis represents distance and the vertical axis represents signal power in FIGS. 4A and 4B. As the EOTPR signal goes beneath the noise floor, it generally cannot be detected at and beyond the distance at which the signal goes beneath the noise floor, which for FIG. 4A is approximately 150 nm and for FIG. 4B is approximately 275 nm. The two graphs illustrate the challenges faced when using currently available tools and techniques to perform fault isolation in structures like those illustrated in FIGS. 1 and 2A.

Figure 5:
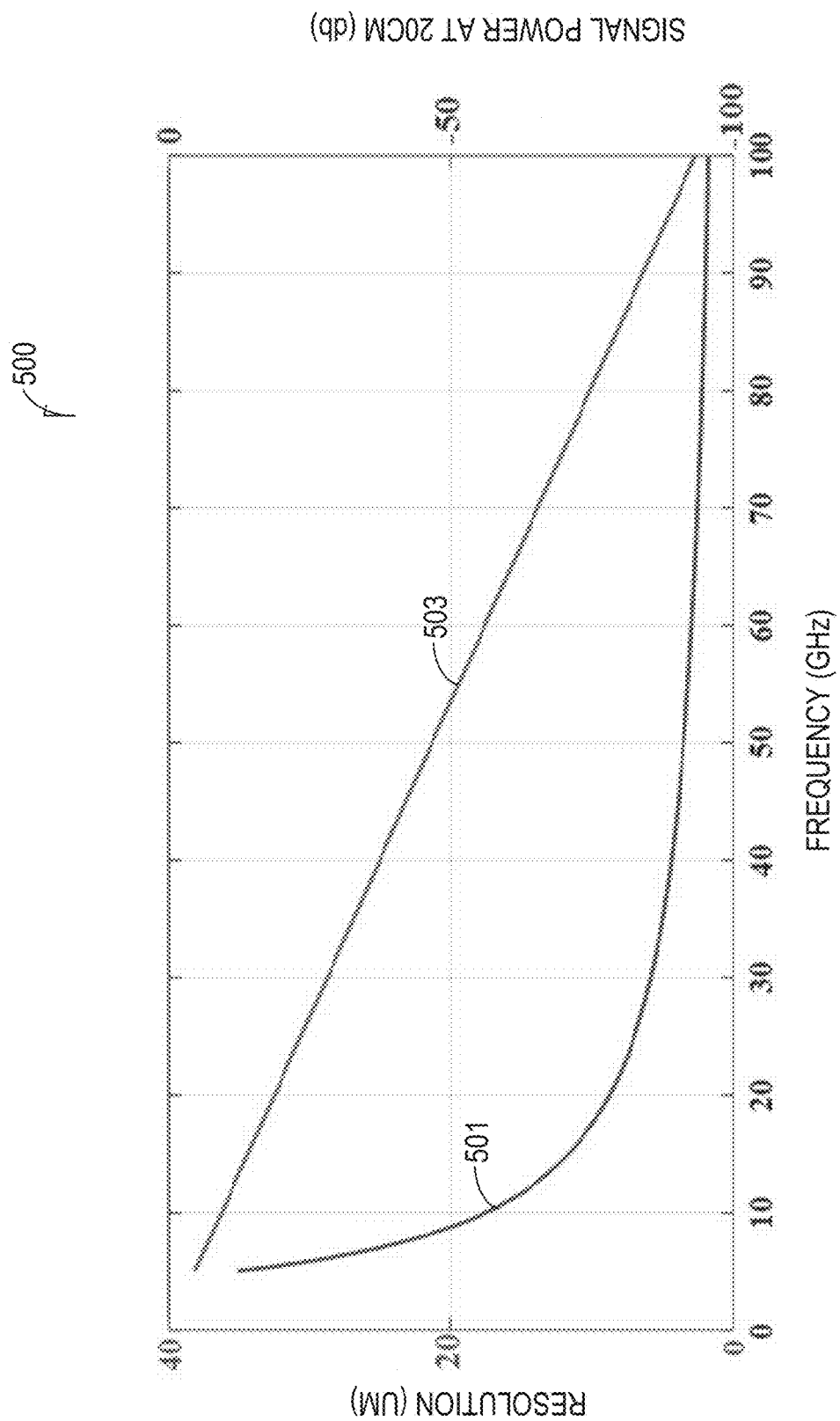
FIG. 5 illustrates results of a TDR-based fault isolation method, according to some embodiments.

FIG. 5 illustrates results of a TDR based fault isolation method, according to some embodiments. TDR based fault isolation can be compromised between resolution and detection length. As frequency increases to help with fault isolation resolution, detectable signal travel distance is shortened which limits its application for 2.5D and 3D packages. Resolution of the reflectometry techniques are estimated by the number of sample points per meter. The number of sample points is directly proportional to the accuracy in locating the open fault. FIG. 5 demonstrates that the resolution increases with the frequency. Therefore, the reflectometry techniques have a trade-off between the penetration distance and resolution. Unfortunately, this trade-off cannot be achieved because the currently known TDR/EOTPR do not have the options to vary the source frequency. In FIG. 5, the horizontal axis represents frequency that varies from 0 to 100 GHz, in some embodiments. The left vertical axis represents resolution in microns, with the resolution improving as the resolution numbers decrease. The right vertical axis represents signal power in dB at 20 centimeters from the point at which the signal enters the package, such as those illustrated in FIG. 1 or FIG. 2A, in some embodiments. Graph 503 illustrates how the signal power degrades at 20 centimeters with increased frequency. However, graph 501 illustrates that resolution improves with increased frequency. FIG. 5 illustrates a dilemma that as frequency increases one can achieve improved resolution, but at the same time signal power degrades precipitously and signal detectability does not travel far into the package. Consequently, one cannot achieve both high resolution so that the defect location can be identified, and good signal power at a long distance into the package, at a frequency of, say, 100 GHz. On the other hand, one can achieve relatively good power at 20 centimeters into the package at 10 GHz, approximately −5 dB, but the resolution is poor, say 35 microns. Therefore, some type of trade off would be required with this technique. However, as discussed above, such a tradeoff is not usually available.

Shortcomings of the above methods can be overcome by a fault resolution method disclosed herein that is based on the unique relationship between transmission line length and its resonant frequency. The resonance in a transmission line is a similar phenomenon to the resonance of an antenna or of an organ pipe that has nodes and antinodes. Resonance in the instant context is defined as a condition at a specific frequency for which the inductive energy is equaled by the capacitive energy. The frequency at which this condition is established is called the resonant frequency. Resonance behavior along the transmission line, or trace, is observed by measuring the impedance profile (discussed below with respect to FIG. 6A) as input frequencies sweep from low to high. The nodes and antinodes occur at multiples of quarter wavelengths from the open location, in some embodiments. The open location is thus related to the resonance behavior and can be calculated based on the resonant frequency. This new method will be referred to herein as Resonance Analysis for Defect Localization (RADL) based on its principle of operation. It is better than any known existing solutions, with 100× longer detection length and with much better detection accuracy and resolution through the detection length.

As mentioned above, RADL has been shown to increase detectable signal propagation distance by more than 100× compared to known tools and techniques. RADL is a frequency domain technique using a sinusoidal signal shape, as opposed to previous time domain techniques using broadband signals. Frequency adjustment at the input enables maximum penetration distance within essentially any lossy traces. RADL is based on a steady state response of the traces and hence the transient effects are naturally eliminated and limits signal degradation over length. RADL achieves very high signal to noise ratio of above 110 dB compared to about 80 db of known existing tools, thus allowing for clear distinction of the signal for the reflection measurement for better measurement accuracy.

RADL also has the option to achieve very high spatial resolution, down to microns (um) of the measurement, by adjusting the number of frequency sample points, at a distance well beyond the approximately 150 um distance achievable by known existing tools.

Figure 6A:
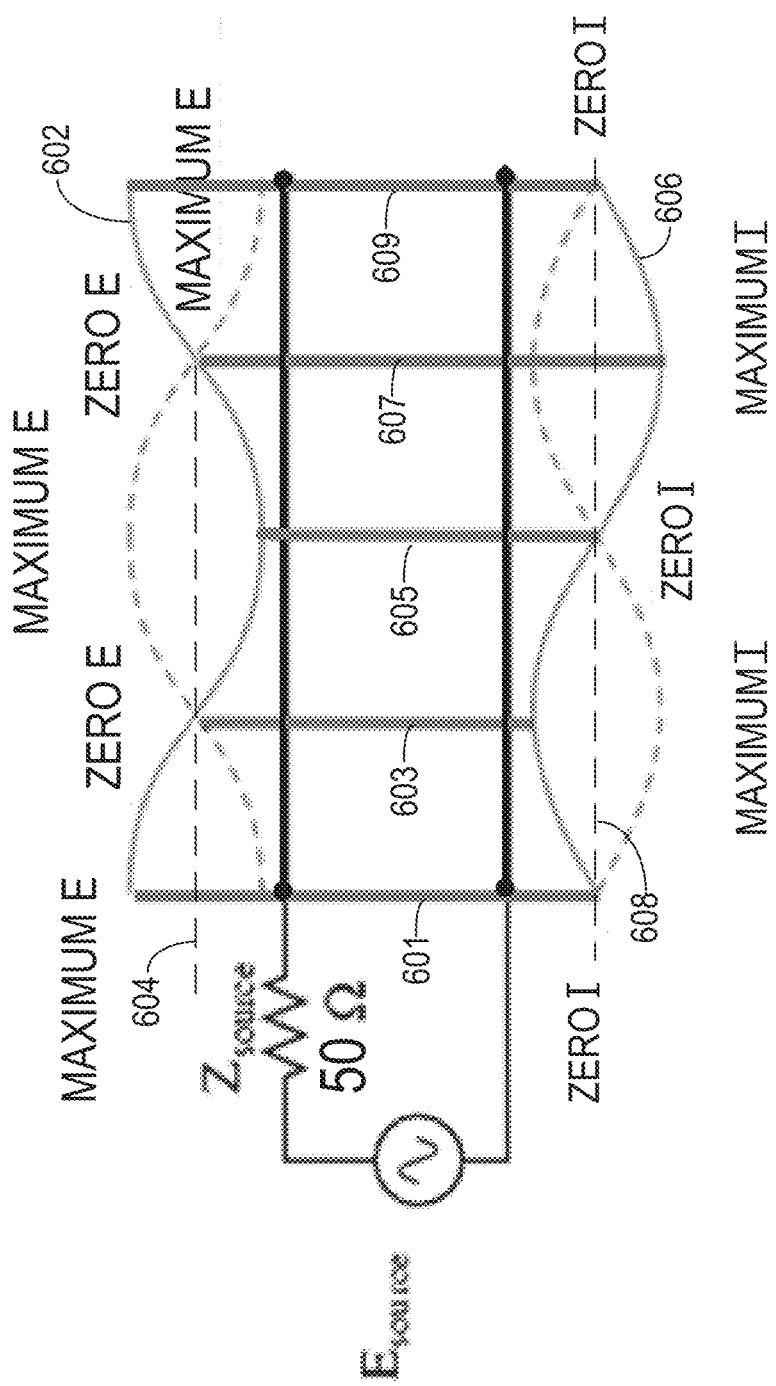
FIGS. 6A and 6B illustrate variation of voltage and current along the length of an open-circuited transmission line, according to some embodiments.
Figure 6B:
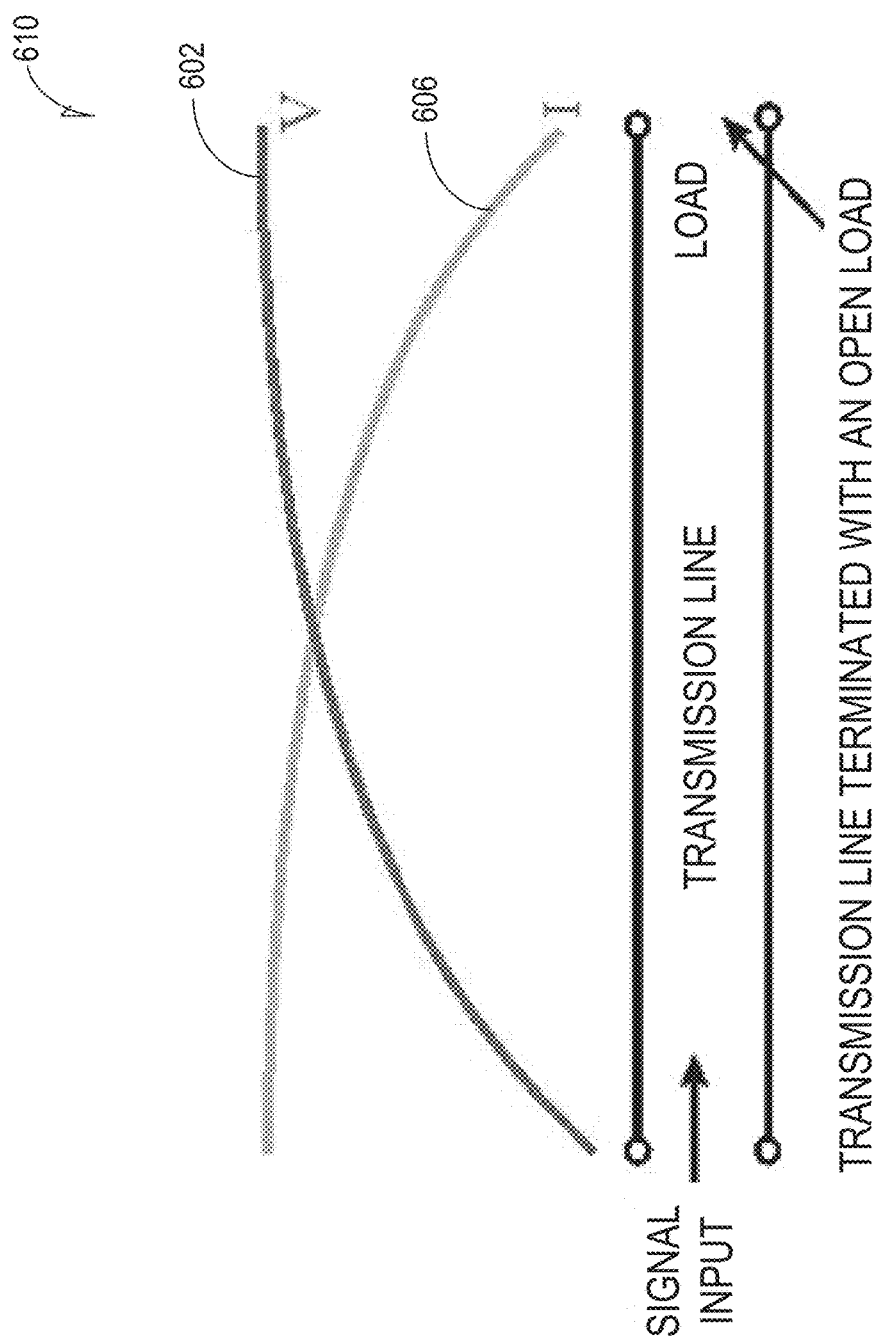

FIGS. 6A and 6B illustrate variation of voltage and current along the length of an open-circuited transmission line. The voltage source is illustrated as $E_{SOURCE}$ with impedance illustrated as $Z_{SOURCE}$. The nodes (resonance) and antinodes (anti-resonance) in an open circuited transmission line are described by the ratio of voltage to current along its length as shown in FIG. 6A. One full wavelength is illustrated in FIG. 6A. For reference, zero axes are illustrated in dash lines 604 and 608. The voltage curve is illustrated as 602 with maxima where lines 601, 605 and 609 meet the voltage curve and with zero value where lines 603 and 607 meet the voltage curve. For the open circuit transmission line, current curve 606 is ninety degrees out of phase with the voltage curve, with maxima where lines 603 and 607 meet the current curve and with zero value where lines 601, 605 and 609 meet the current curve. The first resonance point into the device under test is the location point where there is an open failure along the signal path. The impedance profile can be computed over the wavelength illustrated in FIG. 6A. The impedance profile over one wavelength is the voltage divided by the current along the wavelength. Impedance maxima (essentially infinite) is where lines 601, 605 and 609 meet the transmission line since the impedance is voltage divided by current (zero at 601, 605 and 609), here a voltage maxima divided by zero (which is infinity, or undefined). Impedance minima is where lines 603 and 607 meet the transmission line because at those points voltage is zero and current is at a maxima, and therefore impedance is zero. The entire impedance profile over the wavelength can be computed similarly using values for $E_{SOURCE}$ defined by the user. The figure therefore illustrates where the resonances occur. Further, the defect location is located at the first point into the device under test where the voltage is maximum and the current is zero, making the E/I ratio, or impedance, infinite as discussed. Consequently, wherever the ratio E/I goes to infinity is where the resonances occur, which depends on the wavelength, there being multiple resonances along the transmission lines when there is an open circuit. In other words, whenever resistance goes to infinity a resonance occurs. The first resonance point defines the defect location based on the wavelength of the input signal from $E_{SOURCE}$. FIG. 6B illustrates an enlarged view of a resonance, where voltage 602 reaches a maxima at the far right of the voltage curve, and where the current curve 606 reaches a zero value, also at the far right of the current curve, toward the open load end of the transmission line. The resistance goes to infinity at that point, which means the current goes to zero, at half wavelength increments. But, the first resonance is used to determine the defect location, which means applying equation (1), discussed below, to the first resonance into the package where the current goes to zero and the voltage is maximum. This is where the open failure defect is. At that point, the frequency is changed to one particular frequency whose distance from the input to the defect location is essentially exactly a quarter wavelength. Identifying that particular frequency, calculating its wavelength and dividing the resulting quantity by four, gives the defect location from the input.

Figure 7:
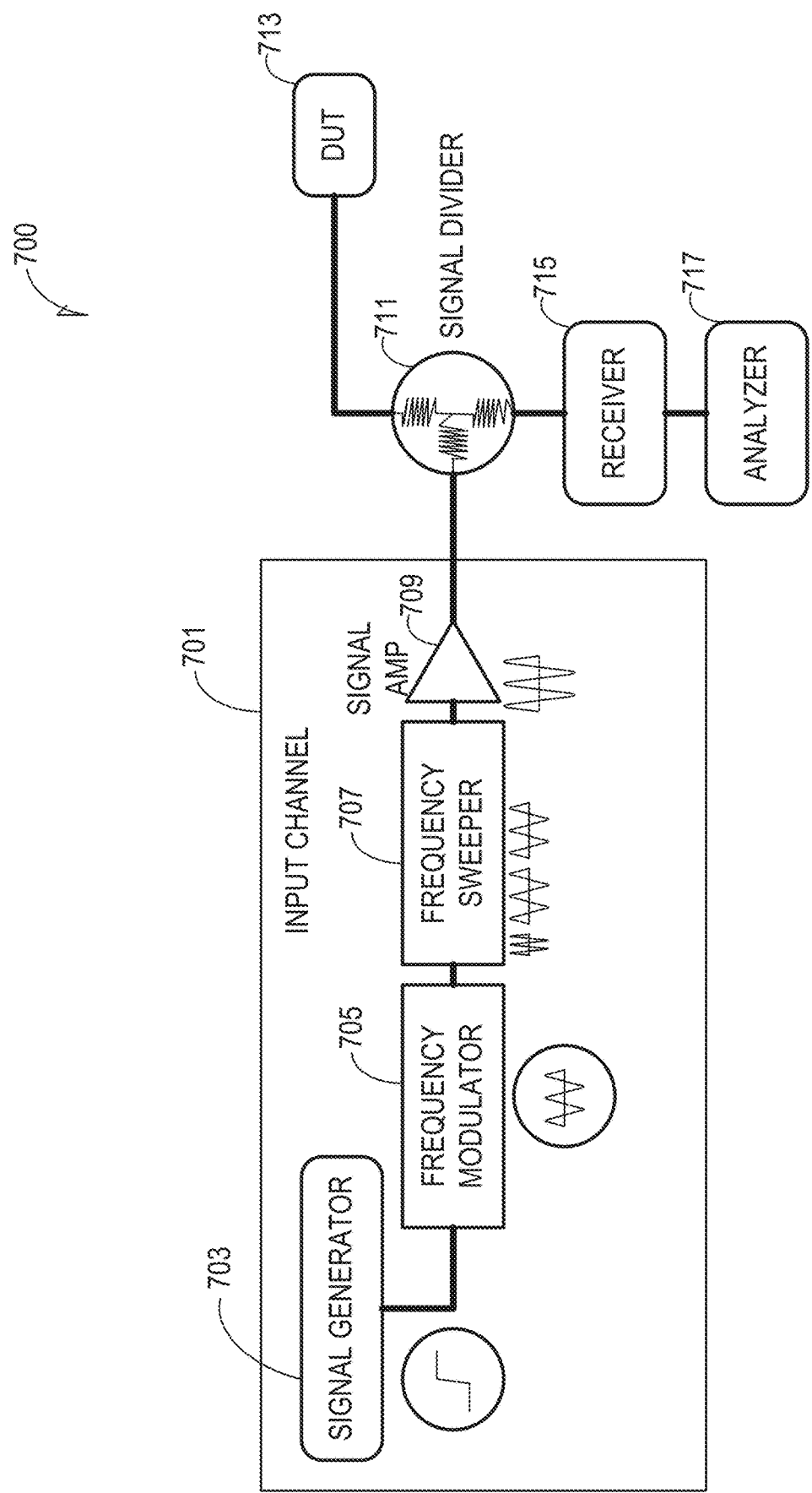
FIG. 7 illustrates a measurement setup for a Resonance Analysis for Defect Localization (RADL) method, according to some embodiments.

FIG. 7 illustrates a measurement setup 701 for the RADL method, according to some embodiments. As discussed above, RADL is used to isolate open faults on long substrate traces and daisy chains. The RADL procedure involves exciting a faulty trace with a sinusoidal voltage waveform and using a frequency domain tool such as a Vector Network Analyzer (VNA) for fault location detection. The VNA inputs to the faulty trace sinusoidal voltage waveforms of different frequencies from a signal generator, for a frequency sweep, and measures the reflected voltage waveform from the trace for each of those frequencies. The window of the frequency sweep and its size of increment are assumed by the user. The plot of the ratio of reflected voltage waveform to the incident voltage waveform is used to determine the impedance profile at the input. The location of the resonant frequency is identified from the input impedance profile and the fault or defect location is calculated from the corresponding resonant frequency. Signal generator 703 is connected to frequency modulator 705 which essentially generates the signal frequency for the frequency sweep. The frequency is swept by frequency sweeper 707 and fed via amplifier 709 to a signal divider 711. From there part of the signal is transmitted to the device under test 713, which reflects part of the signal back to the receiver 715 where it is analyzed by Vector Network Analyzer 717. Operation is as discussed in the foregoing part of this paragraph.

Figure 8:
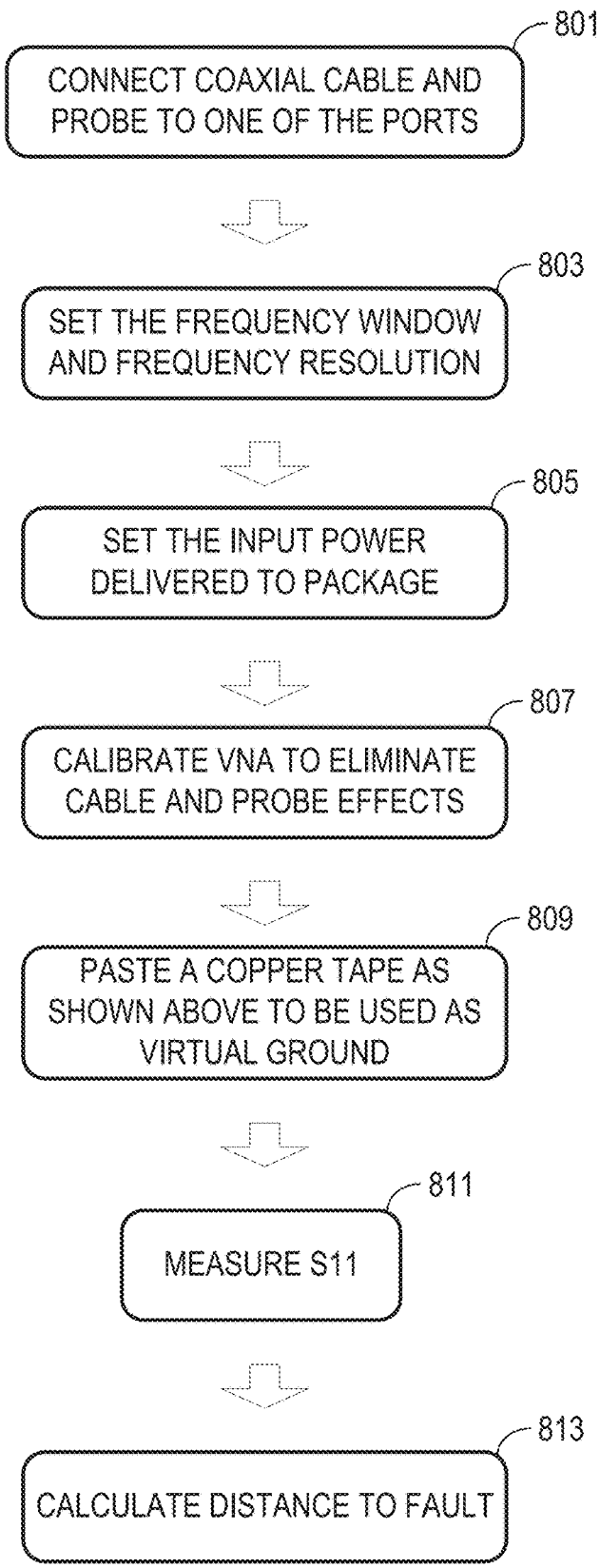
FIG. 8 illustrates a process flow of RADL, according to some embodiments.

FIG. 8 illustrates a process flow of RADL, according to some embodiments. The VNA is connected to the land grid array/ball grid array (LGA/BGA) pads using coaxial cable terminated with a signal-ground (SG) probe, as at 801. A copper tape may be used as a virtual ground for the SG probe. The VNA generally has multiple ports. RADL is a one-port measurement technique. As illustrated in FIG. 8, once the VNA is connected to the faulty trace, the frequency sweep window and the size of increment are set as at 803.

In some embodiments the input power may be set to default as at 805 since this technique does not necessitate huge power. Those of ordinary skill in the art will appreciate that other power settings can be used depending on the overall setup. This is followed by calibration of the VNA as at 807 to eliminate the effects of the coaxial cable and the probe. The copper tape that is used as a virtual ground should be pasted at the maximum distance allowed by the GS probe as at 809 because any closer distance introduces false resonances in the measurement. The VNA is adjusted for S11 (Ratio of reflected voltage to incident voltage) measurement as at 811. The Distance to Fault (DTF) is calculated from the resonant frequency as being the first quarter wavelength resonance point of the current frequency of the frequency sweep, as:

$$DTF = \frac{.25 \times \text{Velocity factor} \times 3 \times 10^8}{f_R} = 0.25\lambda \quad (1)$$

Where $f_R$ is the resonant frequency, and

Velocity factor is the material property of the substrate or silicon.

The method has been verified using a 3D electromagnetic simulation tool, in this case a high frequency structure simulator (HFSS). A 3D model of a faulty trace was created in HFSS and excited with sinusoidal voltage waveforms. The frequency of the sinusoidal waveforms was swept and plots of S11 and input impedance were obtained to identify the resonant frequency. Long substrate traces and daisy chains were modeled in HFSS to determine their resonant frequencies.

Figure 9:
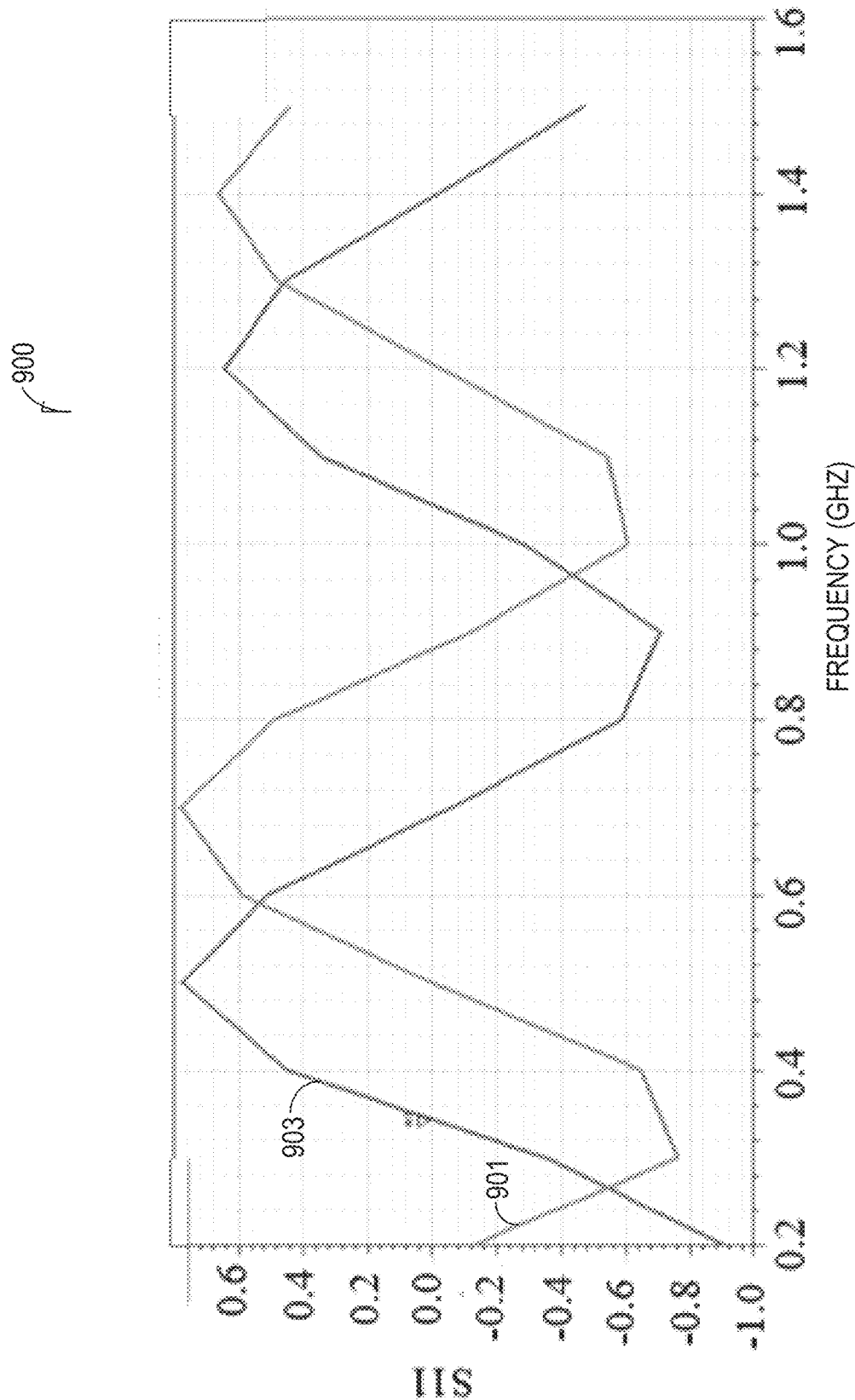
FIG. 9 illustrates a simulated S11 plot of a lossy substrate trace with an open fault at 100 nm, according to some embodiments.

FIG. 9 illustrates a S11 plot of a lossy substrate trace with an open fault at 100 mm, according to some embodiments. This plot illustrates how to identify the resonant frequency from the information fed back from the device under test 713 to receiver 715 of FIG. 7. Identification of the point along the trace at which the resistance goes to infinity, for the frequency of the frequency sweep, identifies the point of resonance. This plot comprises a real part illustrated by curve 901 and an imaginary part illustrated by curve 903. At resonance at a particular frequency, the imaginary part 903 is zero at that frequency. The first time the imaginary part goes to zero is the location of the open fault defect. As can be seen from the plot, curve 903 repeatedly crosses zero as the frequency increases.

The corresponding frequencies where curve 903 crosses zero can be used to improve the resolution of the defect location by applying equation (2).

$$DTF = \frac{0.25N \times \text{velocity factor} \times 3 \times 10^8}{f_{rN}} = 0.25N\lambda \quad (2)$$

Where $f_{rN}$ is the Nth resonant frequency, velocity factory is a property of the material of the device;

and N is an interger that varies as 1, 2, 3, ... and goes on.

For Equation (2), DTF (Distance to fault) depends on which resonant frequency f,N the calculation is made with, with an increment of 0.25 for each of the resonant frequencies. N=1 is the first resonant frequency. N=2 represents the second resonant frequency. N=3 represents the third and so on. Repeated calculations are made for different resonant frequencies of the frequency sweep. If the repeated calculations for different resonant frequencies converge to the same location. If there is such convergence, this confirms the first location of the defect (the equivalent of equation (1)). In some embodiments the first three resonant frequencies, N=1, N=2, N=3 are used for equation (2) to improve the determination of the fault location and in some embodiments the first four resonant frequencies are used, N=1, N-2, N=3, N=4, which in these embodiments provide a satisfactory confirmation of the location of fault that was calculated using the first frequency of the sweep. A reason for repeated calculations is to take into account imperfections of the transmission line due to the transmission line proceeding through different materials. The plot of FIG. 9 was obtained from a simulation such as that described above for a lossy trace of 100 mm in length. The S11 plot has both real and imaginary parts traced against the frequency. The resonant frequency corresponds to Real ({S11}=-1) and Imaginary ({S11}=0) components. DTF is then determined from the resonant frequency. The DTF thus obtained after the modification is 99.8 mm which is close to the original fault location.

The concept is also verified experimentally by testing it on substrate traces and daisy-chains. Adjustments should be made to eliminate the extra lengths added by the vias and solder bumps. A long daisy chain of length 659 mm with an open at the end has been tested successfully, according to some embodiments.

Figure 10:
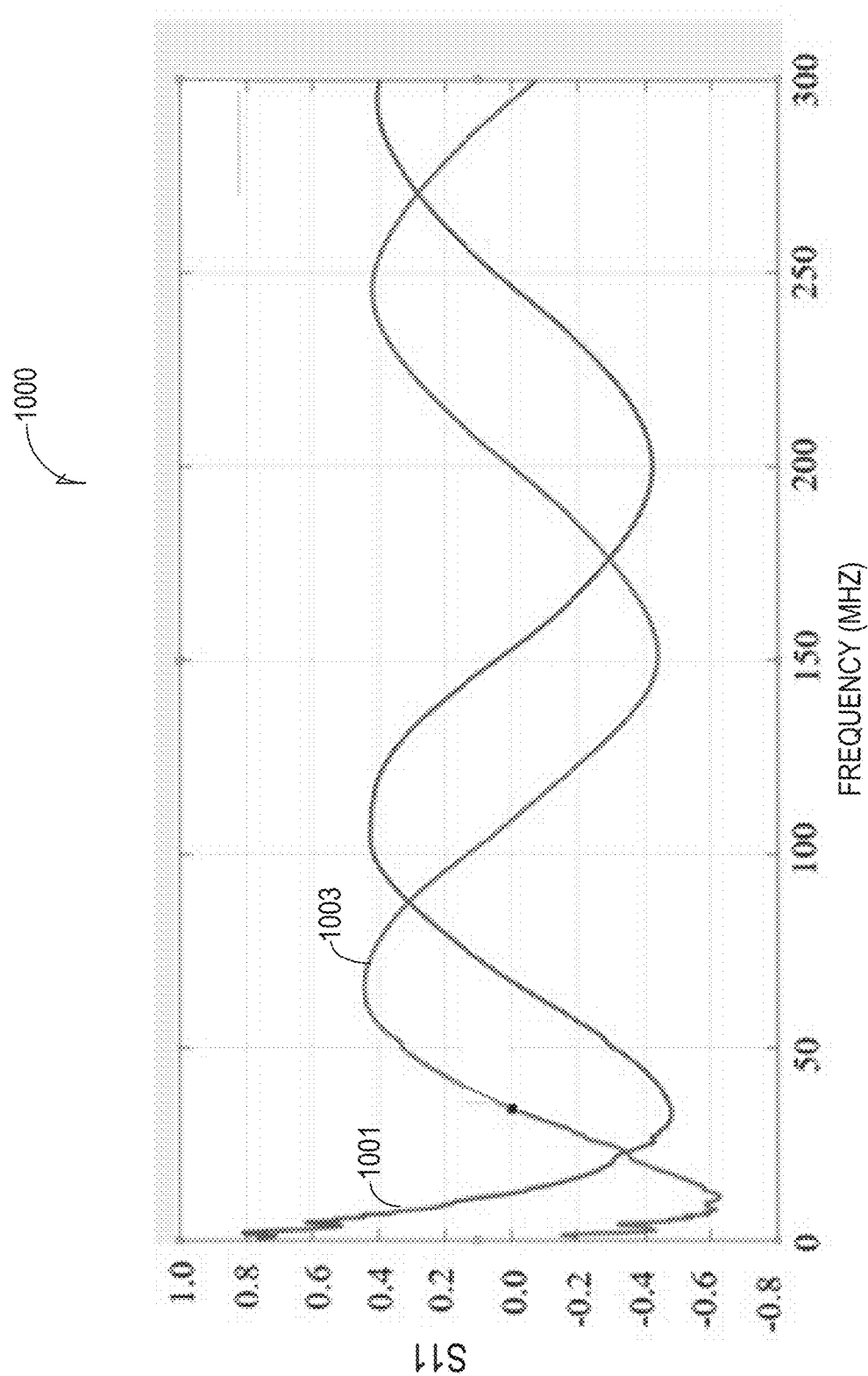
FIG. 10 illustrates measured results from applying RADL to open nets of different lengths, according to some embodiments.

FIG. 10 illustrates results from applying RADL to open nets of different lengths, according to some embodiments to measure S11 as a function of frequency. The curves of FIG. 10 are measured results versus the simulated results of FIG. 9. As with FIG. 9, the imaginary part of S11 is curve 1003 and the real part is curve 1001. Again, the sweep frequencies where the curve representing the imaginary part of S11 crosses zero, for example 34 MHz, is where resonance occurs, the first resonance indicating the location of the open fault, with additional resonance frequencies used to confirmation of the result, as explained with respect to FIG. 9, Currently known TDR techniques cannot isolate the fault location owing to its attenuation along the long trace. RADL is used to identify the resonant frequency by measuring S11 which is shown in FIG. 10. The resonant frequency was identified as 34.27 MHz and the corresponding DTF was obtained as 665.6 mm with an error percentage of 0.9 percent.

Figure 11:
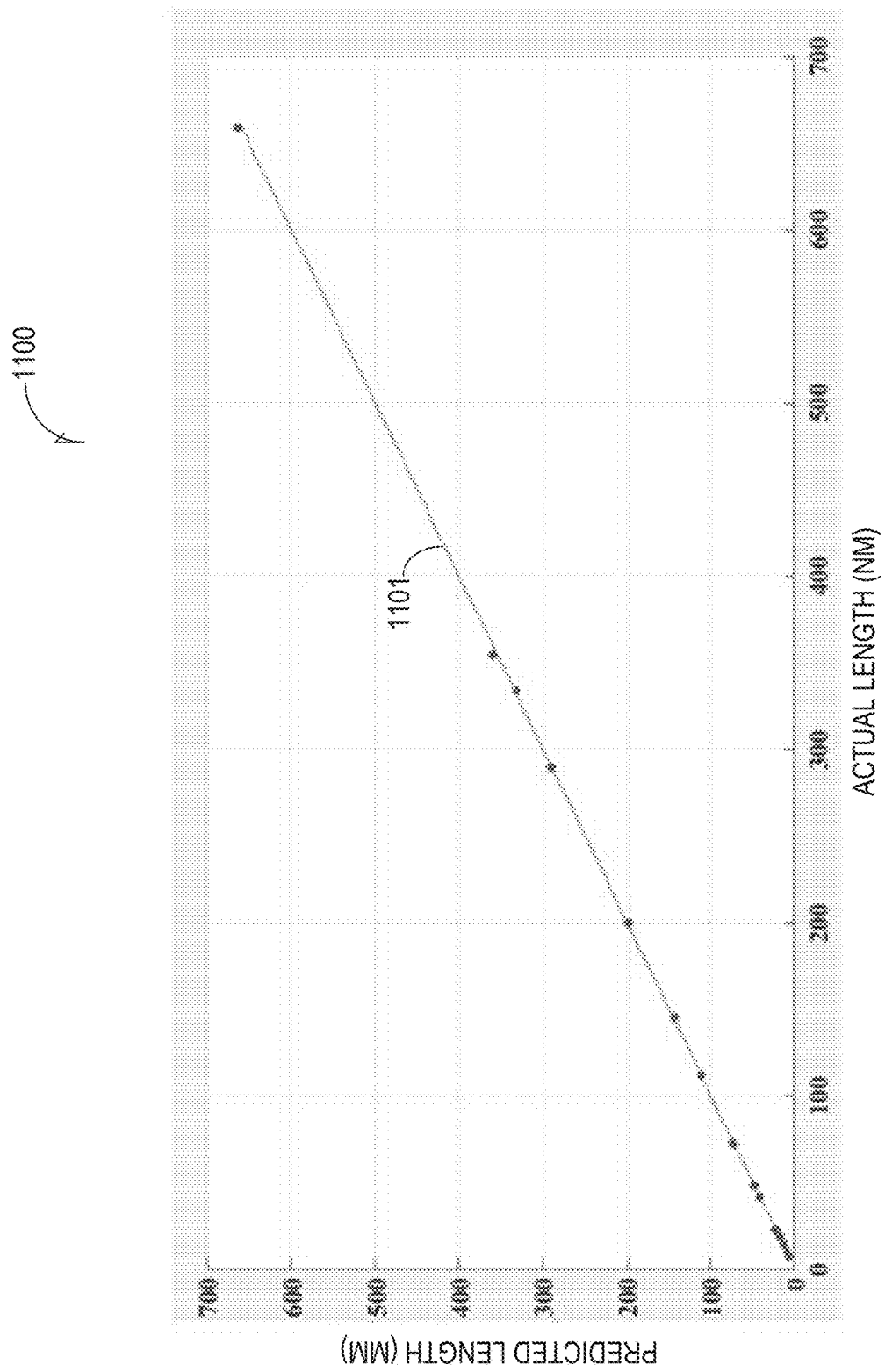
FIG. 11 illustrates a comparison of actual and predicted lengths of open fault locations for different traces used in a verification test, according to some embodiments.

FIG. 11 illustrates a comparison of the actual and predicted lengths of the open fault locations for different traces used in a verification test, according to some embodiments. The method was applied to nets of different length, and the predicted DTF agrees well with the actual fault location confirming its candidacy as a fault isolation technique, as shown in FIG. 11. This can be seen by the dots that represent data points collected on curve 1101, Fitting curve 1101 to the dots and reading actual length versus predicted length relative to curve 1101 indicates that prediction and actual correlate well.

Figure 12:
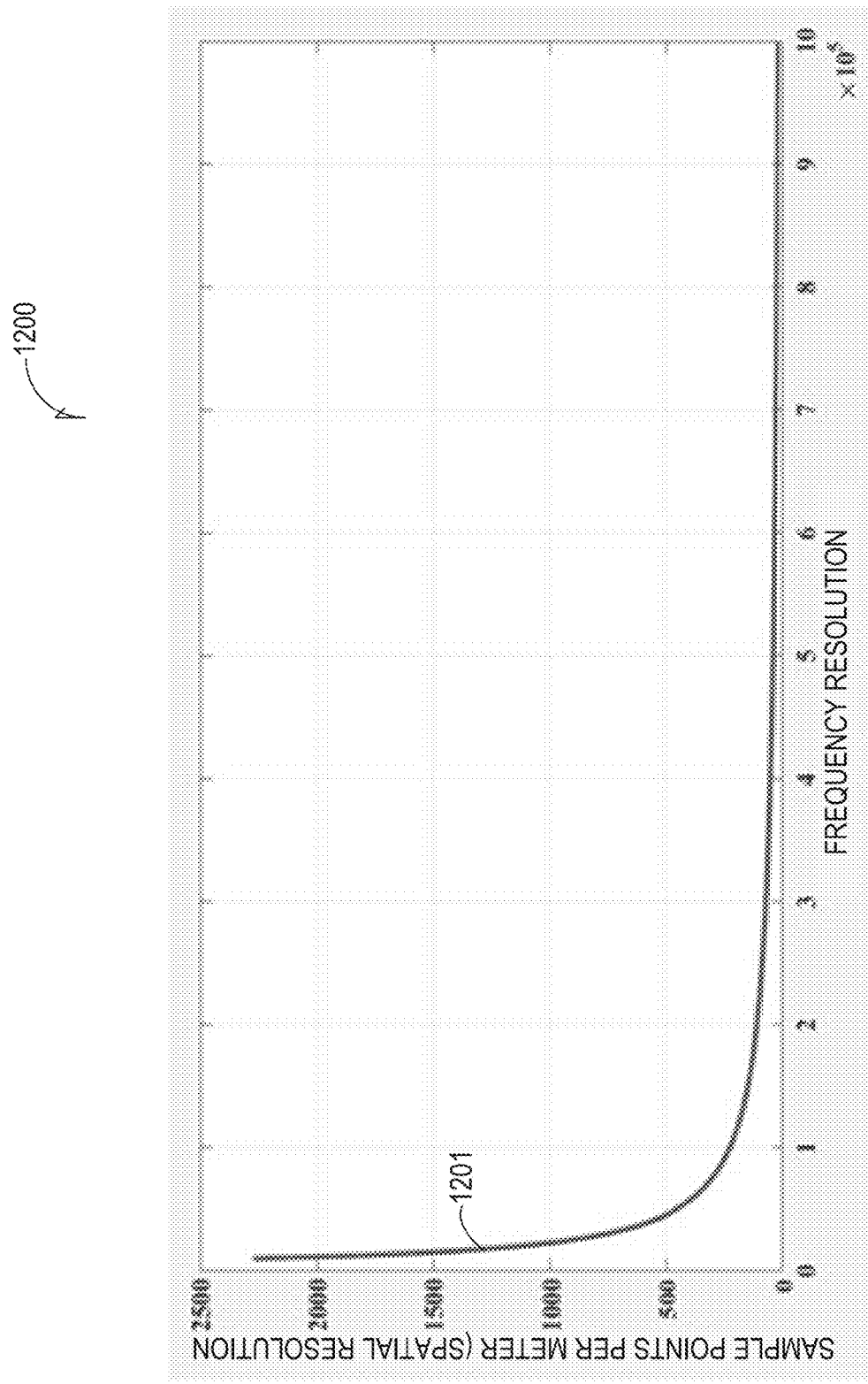
FIG. 12 illustrates spatial resolution as a function of frequency increment size in a frequency sweep, according to some embodiments.

FIG. 12 illustrates spatial resolution as a function of frequency increment size in a frequency sweep, according to some embodiments. The resolution of fault detection in RADL is limited only by the size of increment of the frequency sweep resolution. The maximum propagation distance and the spatial resolution are decoupled in RADL which aids in open fault isolation in long daisy-chains and substrate traces where TDR/EOTPR pulses cannot penetrate. RADL can achieve less than 10 um level using a high frequency tool compared to a typical 300 um achievable by TDR using known existing tools.

Figure 13:
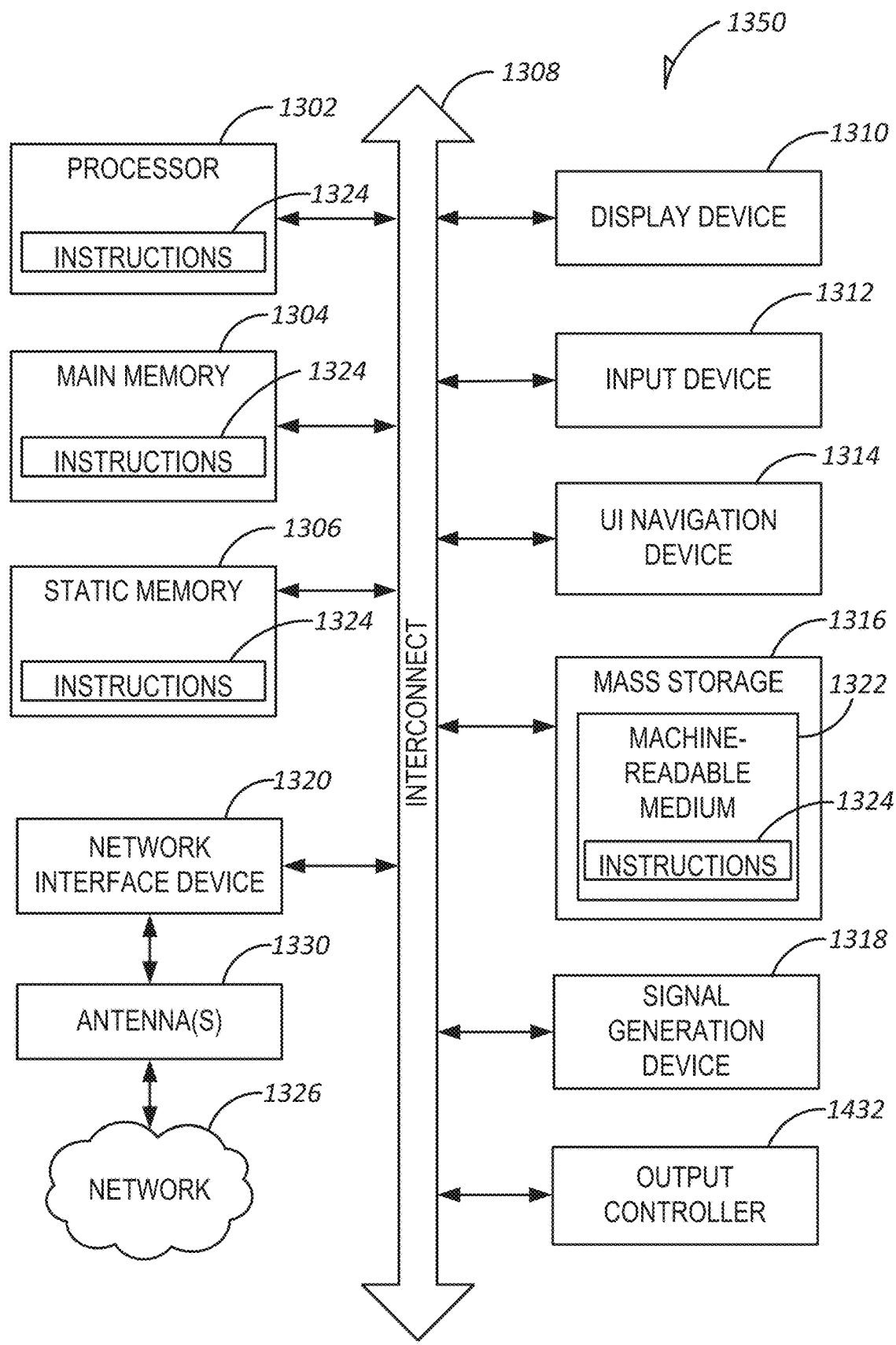
FIG. 13 illustrates a block diagram of an example machine upon which, or by which, any one or more of the processes, techniques (e.g., methodologies) discussed herein that involve calculation or measurement may be performed, according to some embodiments.

FIG. 13 illustrates a block diagram of an example machine 1350 upon which, or by which, any one or more of the processes, techniques (e.g., methodologies) discussed herein that involve calculation or measurement may be performed, in some embodiments. In alternative embodiments, the machine 1350 may operate as a standalone device or may be connected (e.g., networked) to other machines. In a networked deployment, the machine 1350 may operate in the capacity of a server machine, a client machine, or both in server-client network environments. In an example, the machine 1350 may act as a peer machine in peer-to-peer (P2P) (or other distributed) network environment. The machine 1350 may be a personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Machine (e.g., computer system) may include a hardware processor 1302 (e.g., a central processing unit (CPU), a graphics processing unit (GPU), a hardware processor core, or any combination thereof), a main memory 1304 and a static memory 1306, some or all of which may communicate with each other via an interlink (e.g., bus) 1308. The machine 1350 may further include a display unit 1310, an alphanumeric input device 1312 (e.g., a keyboard), and a user interface (UI) navigation device 1314 (e.g., a mouse). In an example, the display unit 1310, input device 1312 and UI navigation device 1314 may be a touch screen display. The machine 1350 may additionally include a storage device (e.g., drive unit) 1316, a signal generation device 1318 (e.g., a speaker), a network interface device 1320, and one or more sensors, such as a global positioning system (GPS) sensor, compass, accelerometer, or other sensor. The machine 1350 may include an output controller 1328, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1316 may include a machine readable medium 1322 on which is stored one or more sets of data structures or instructions 1324 (e.g., software) embodying or utilized by any one or more of the techniques or functions described herein. The instructions 1324 may also reside, completely or at least partially, within the main memory 1304, within static memory 1306, or within the hardware processor 1302 during execution thereof by the machine. In an example, one or any combination of the hardware processor 1302, the main memory 1304, the static memory 1306, or the storage device 1316 may constitute machine readable media.

While the machine readable medium 1322 is illustrated as a single medium, the term "machine readable medium" may include a single medium or multiple media (e.g., a centralized or distributed database, and/or associated caches and servers) configured to store the one or more instructions 1324.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); Dynamic Random Access Memory (DRAM); and CD-ROM and DVD-ROM disks. In some examples, machine readable media may include non-transitory machine readable media. In some examples, machine readable media may include machine readable media that is not a transitory propagating signal.

The instructions 1324 may further be transmitted or received over a communications network 1326 using a transmission medium via the network interface device 1320 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 1320 may include one or more physical jacks (e.g., Ethernet, coaxial, or phone jacks) or one or more antennas to connect to the communications network 1326. In an example, the network interface device 1320 may include a plurality of antennas to wirelessly communicate using at least one of single-input multiple-output (SIMO), multiple-input multiple-output (MIMO), or multiple-input single-output (MISO) techniques. In some examples, the network interface device 1320 may wirelessly communicate using Multiple User MIMO techniques. The term "transmission medium" shall be taken to include any intangible medium that is capable of storing, encoding or carrying instructions for execution by the machine, and includes digital or analog communications signals or other intangible medium to facilitate communication of such software.

Examples

Example 1 is a method of determining distance to an electrical fault within a device, the method comprising: exciting the device with an electrical input signal, the device comprising an open circuited electrical transmission line; analyzing, by a frequency domain analyzer, a part of the signal reflected from the device, determining, from the analyzing, locations of resonant frequency of the signal within the device; and calculating the distance to the fault within the device based on the resonant frequency.

In Example 2, the subject matter of Example 1 optionally includes wherein the distance to the fault (DTF) is calculated as $$DTF = \frac{.25 \times \text{Velocity factor} \times 3 \times 10^8}{f_R} = 0.25\lambda$$

where $f_R$ is the resonant frequency, and

Velocity factor is a property of the material of the device.

In Example 3, the subject matter of any one or more of Examples 1-2 optionally include wherein the distance to the fault is one quarter wavelength distance into the device at the resonant frequency.

In Example 4, the subject matter of any one or more of Examples 1-3 optionally include the method further comprising confirming the distance to the fault by repeatedly calculating the distance to the fault at a plurality of resonant frequencies in a frequency sweep of the signal, the confirmation comprising convergence of the result of the repeated calculations to substantially a same location.

In Example 5, the subject matter of any one or more of Examples 1-4 optionally include wherein the signal comprises a sinusoidal voltage waveform and a sinusoidal current waveform ninety degrees out of phase with the voltage waveform, and the resonant frequency locations in the device comprise locations at which the current is zero.

In Example 6, the subject matter of any one or more of Examples 4-5 optionally include wherein confirming the distance to the fault by repeatedly calculating the distance to the fault at a plurality of resonant frequencies comprises applying the equation $$DTF = \frac{0.25N \times \text{velocity factor} \times 3 \times 10^8}{f_{rN}} = 0.25N\lambda$$

where $f_{rN}$ is the Nth resonant frequency of the frequency sweep;

velocity factor is a property of the material of the device;

and N is an integer that varies as 1, 2, 3, ...and goes on.

In Example 7, the subject matter of any one or more of Examples 1-6 optionally include wherein the device comprises one of a substrate trace or a micro-bump interconnect or a through-silicon via (TSV) chain.

In Example 8, the subject matter of Example 7 optionally includes wherein the device comprises silicon and a non-silicon substrate through which a TSV chain is routed.

In Example 9, the subject matter of any one or more of Examples 1-8 optionally include wherein the device comprises a hyperchip structure or an embedded multichip interconnect bridge.

In Example 10, the subject matter of any one or more of Examples 1-9 optionally include wherein the distance to the fault is the distance to the first location of resonant frequency in the device.

In Example 11, the subject matter of any one or more of Examples 1-10 optionally include wherein nodes and anti-nodes of the signal occur at multiples of quarter wavelengths from the fault.

In Example 12, the subject matter of any one or more of Examples 1-11 optionally include wherein an impedance profile of the device is the value of the voltage wave divided by the value of the current wave along a wavelength within the device at the resonant frequency.

In Example 13, the subject matter of Example 12 optionally includes wherein the signal is applied to the device via a signal divider, and the ratio of reflected signal to applied signal is used to determine the impedance profile at the input of the device.

In Example 14, the subject matter of Example 13 optionally includes wherein the location of the resonant frequency is determined from the impedance profile.

Example 15 is a system for determination of distance to an electrical fault within a device, the system comprising: a signal generator configured to excite the device with an electrical input signal, the device comprising an open circuited electrical transmission line; a frequency domain analyzer configured for analysis of a part of the signal reflected from the device and for determination from the analysis the locations of resonant frequency of the signal within the device; and at least one hardware processor configured to calculate the distance to the fault within the device based on the resonant frequency.

In Example 16, the subject matter of Example 15 optionally includes wherein the distance to the fault (DTF) is calculated as $$DTF = \frac{.25 \times \text{Velocity factor} \times 3 \times 10^8}{f_R} = 0.25\lambda$$

Where $f_R$ is the resonant frequency, and

Velocity factor is a property of the material of the device.

In Example 17, the subject matter of any one or more of Examples 15-16 optionally include wherein the distance to the fault is one quarter wavelength distance into the device at the resonant frequency.

In Example 18, the subject matter of any one or more of Examples 15-17 optionally include the system further comprising a frequency sweep device configured to sweep the frequency of the input signal to confirm the distance to the fault by repeated calculation of the distance to the fault at a plurality of resonant frequencies during a frequency sweep of the input signal, the confirmation comprising convergence of the result of the repeated calculations to substantially a same location.

In Example 19, the subject matter of any one or more of Examples 15-18 optionally include wherein the signal comprises a sinusoidal voltage waveform and a sinusoidal current waveform ninety degrees out of phase with the voltage waveform, and the resonant frequency locations in the device comprise locations at which the current is zero.

In Example 20, the subject matter of Example 19 optionally includes wherein confirmation of the distance to the fault by repeated calculation of the distance to the fault at a plurality of resonant frequencies comprises application, by the at least one hardware processor, of the equation $$DTF = \frac{0.25N \times \text{velocity factor} \times 3 \times 10^8}{f_{rN}} = 0.25N\lambda$$

where $f_{rN}$ is the $N$th resonant frequency;

velocity factor is a property of the material of the device;

and $N$ is the integer that varies as 1, 2, 3, ... and goes on.

In Example 21, the subject matter of any one or more of Examples 15-20 optionally include wherein the device comprises one of a substrate trace or a micro-bump interconnect or a through-silicon via (TSV) chain.

In Example 22, the subject matter of Example 21 optionally includes wherein the device comprises silicon and a non-silicon substrate through which a TSV chain is routed.

In Example 23, the subject matter of any one or more of Examples 15-22 optionally include wherein the device comprises a hyperchip structure or an embedded multichip interconnect bridge.

In Example 24, the subject matter of any one or more of Examples 15-23 optionally include wherein the distance to the fault is the distance to the first location of resonant frequency of the input signal in the device.

In Example 25, the subject matter of any one or more of Examples 15-24 optionally include wherein nodes and antinodes of the signal occur at multiples of quarter wavelengths from the fault.

In Example 26, the subject matter of any one or more of Examples 15-25 optionally include wherein the at least one hardware processor is further configured to calculate an impedance profile of the device as the value of the voltage wave divided by the value of the current wave along a wavelength within the device at the resonant frequency.

In Example 27, the subject matter of Example 26 optionally includes a signal divider to apply the input signal to the device, the at least one hardware processor further configured to calculate the ratio of reflected signal to applied signal to determine the impedance profile at the input of the device.

In Example 28, the subject matter of Example 27 optionally includes wherein the at least one hardware processor is further configured to calculate the location of the resonant frequency from the impedance profile.

In Example 29, the subject matter can include, or can optionally be combined with any portion or combination of, any portions of any one or more of Examples 1 through 28 to include, subject matter that can include means for performing any one or more of the functions of Examples 1 through 28, or a machine-readable medium including instructions that, when performed by a machine, cause the machine to perform any one or more of the functions of Examples 1 through 28.

All features of the apparatuses described above (including optional features) may also be implemented with respect to the methods or processes described herein.

The invention claimed is:

1. A method of determining distance to an electrical fault within a device, the method comprising:
    exciting the device with an electrical input signal, the device comprising an open circuited electrical transmission line;
    analyzing, by a frequency domain analyzer, a part of the signal reflected from the device;
    determining, from the analyzing, locations of resonant frequency of the signal within the device; and
    calculating the distance to the fault within the device based on the resonant frequency, wherein the distance to the fault (DTF) is calculated as $$DTF = \frac{.25 \times \text{Velocity factor} \times 3 \times 10^8}{f_R} = 0.25\lambda$$

where $f_R$ is the resonant frequency, and

Velocity factor is a property of the material of the device.

2. The method of claim 1 wherein the distance to the fault is one quarter wavelength distance into the device at the resonant frequency.

3. The method of claim 1, the method further comprising confirming the distance to the fault by repeatedly calculating the distance to the fault at a plurality of resonant frequencies in a frequency sweep of the signal, the confirmation comprising convergence of the result of the repeated calculations to substantially a same location.

4. The method of claim 3 wherein confirming the distance to the fault by repeatedly calculating the distance to the fault at a plurality of resonant frequencies comprises applying the equation $$DTF = \frac{0.25N \times \text{velocity factor} \times 3 \times 10^8}{f_{rN}} = 0.25N\lambda$$

Where $f_{rN}$ is the $N$th resonant frequency of the frequency sweep;

velocity factor is a property of the material of the device; and $N$ is an integer that varies as 1, 2, 3, ... and goes on.

5. The method of claim 1 wherein the signal comprises a sinusoidal voltage waveform and a sinusoidal current waveform ninety degrees out of phase with the voltage waveform, and the resonant frequency locations in the device comprise locations at which the current is zero.

6. The method of claim 1 wherein the device comprises one of a substrate trace or a micro-bump interconnect or a through-silicon via (TSV) chain.

7. The method of claim 6 wherein the device comprises silicon and a non-silicon substrate through which a TSV chain is routed.

8. The method of claim 1 wherein the device comprises a hyperchip structure or an embedded multichip interconnect bridge.

9. The method of claim 1 wherein the distance to the fault is the distance to the first location of resonant frequency in the device.

10. The method of claim 1 wherein nodes and antinodes of the signal occur at multiples of quarter wavelengths from the fault.

11. The method of claim 1 wherein an impedance profile of the device is the value of the voltage wave divided by the value of the current wave along a wavelength within the device at the resonant frequency.

12. The method of claim 11 wherein the signal is applied to the device via a signal divider, and the ratio of reflected signal to applied signal is used to determine the impedance profile at the input of the device.

13. The method of claim 12 wherein the location of the resonant frequency is determined from the impedance profile.

14. A system for determination of distance to an electrical fault within a device, the system comprising:
 a signal generator configured to excite the device with an electrical input signal, the device comprising an open circuited electrical transmission line;
 a signal divider configured to apply the input signal to the device;
 a frequency domain analyzer configured for analysis of a part of the signal reflected from the device and for determination from the analysis the locations of resonant frequency of the signal within the device; and
 at least one hardware processor configured to:
  calculate the distance to the fault within the device based on the resonant frequency,
  calculate an impedance profile of the device as the value of the voltage wave divided by the value of the current wave along a wavelength within the device at the resonant frequency; and
  calculate the ratio of reflected signal to applied signal to determine the impedance profile at the input of the device.

15. The system of claim 14 wherein the distance to the fault (DTF) is calculated as $$DTF = \frac{.25 \times \text{Velocity factor} \times 3 \times 10^8}{f_R} = 0.25\lambda$$

where $f_R$ is the resonant frequency, and

Velocity factor is a property of the material of the device.

16. The system of claim 14 wherein the distance to the fault is one quarter wavelength distance into the device at the resonant frequency.

17. The system of claim 14, the system further comprising a frequency sweep device configured to sweep the frequency of the input signal to confirm the distance to the fault by repeated calculation of the distance to the fault at a plurality of resonant frequencies during a frequency sweep of the input signal, the confirmation comprising convergence of the result of the repeated calculations to substantially a same location.

18. The system of claim 14 wherein the signal comprises a sinusoidal voltage waveform and a sinusoidal current waveform ninety degrees out of phase with the voltage waveform, and the resonant frequency locations in the device comprise locations at which the current is zero.

19. The system of claim 18 wherein confirmation of the distance to the fault by repeated calculation of the distance to the fault at a plurality of resonant frequencies comprises application, by the at least one hardware processor, of the equation $$DTF = \frac{0.25N \times \text{velocity factor} \times 3 \times 10^8}{f_{rN}} = 0.25N\lambda$$

Where $f_{rN}$ is the $N$th resonant frequency;

velocity factory is a property of the material of the device;

and $N$ is an interger that varies as 1, 2, 3, ... and goes on.

20. The system of claim 14 wherein the device comprises one of a substrate trace or a micro-bump interconnect or a through-silicon via (TSV) chain.

21. The system of claim 20 wherein the device comprises silicon and a non-silicon substrate through which a TSV chain is routed.

22. The system of claim 14 wherein the device comprises a hyperchip structure or an embedded multichip interconnect bridge.

23. The system of claim 14 wherein the distance to the fault is the distance to the first location of resonant frequency of the input signal in the device.

24. The system of claim 14 wherein nodes and antinodes of the signal occur at multiples of quarter wavelengths from the fault.

25. The system of claim 14, wherein the at least one hardware processor is further configured to calculate the location of the resonant frequency from the impedance profile.

26. A system for determination of distance to an electrical fault within a device, the system comprising:
 a signal generator configured to excite the device with an electrical input signal, the device comprising an open circuited electrical transmission line;
 a frequency domain analyzer configured for analysis of a part of the signal reflected from the device and for determination from the analysis the locations of resonant frequency of the signal within the device; and
 at least one hardware processor configured to:
  calculate the distance to the fault within the device based on the resonant frequency,
  calculate an impedance profile of the device as the value of the voltage wave divided by the value of the current wave along a wavelength within the device at the resonant frequency; and
  calculate the location of the resonant frequency from the impedance profile.

* * * * *